(12) United States Patent
Tanomura

(10) Patent No.: US 6,492,664 B2
(45) Date of Patent: Dec. 10, 2002

(54) HETEROJUNCTION BIPOLAR TRANSISTOR WITH REDUCED OFFSET VOLTAGE

(75) Inventor: Masahiro Tanomura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/874,078

(22) Filed: Jun. 5, 2001

(65) Prior Publication Data

US 2001/0054718 A1 Dec. 27, 2001

(30) Foreign Application Priority Data

Jun. 27, 2000 (JP) ........................... 2000-192995

(51) Int. Cl.$^7$ ............................................. H01L 31/072
(52) U.S. Cl. ...................... 257/183; 257/197; 257/198; 257/591; 257/592
(58) Field of Search ................. 257/197, 198, 257/586, 587, 591, 592, 593, 607

(56) References Cited

U.S. PATENT DOCUMENTS 5,321,302 A * 6/1994 Shimawaki .................. 257/591
6,037,616 A * 3/2000 Amamiya .................... 257/197

FOREIGN PATENT DOCUMENTS

| JP | 04-045539 | 2/1992 |
| JP | 05-062990 | 3/1993 |
| JP | 06-140416 | 5/1994 |
| JP | 08-241896 | 9/1996 |

* cited by examiner

Primary Examiner—Hoai Ho
Assistant Examiner—Mai-Huong Tran
(74) Attorney, Agent, or Firm—Katten, Muchin, Zavis Rosenman

(57) ABSTRACT

A heterojunction bipolar transistor comprises a collector layer, a base layer, and an emitter layer stacked sequentially. The base layer comprises a first base layer joined to the collector layer in an inward base area directly below the emitter layer and a second base layer joined to the collector layer in an outward base area adjacent to the inward base area. The second base layer is formed of a semiconductor with a wider energy band gap than the collector layer.

4 Claims, 9 Drawing Sheets

Fig. 2 a (PRIOR ART)
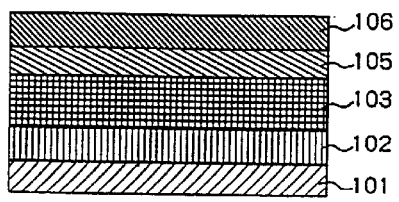
Fig. 2 e (PRIOR ART)
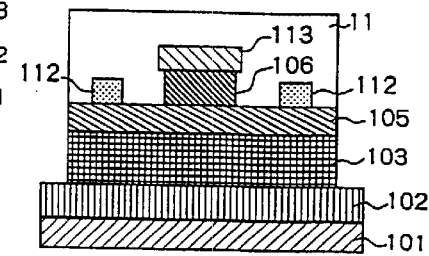
Fig. 2 b (PRIOR ART)
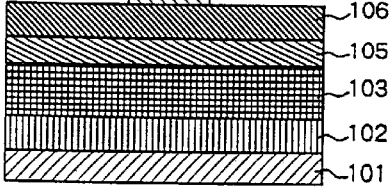
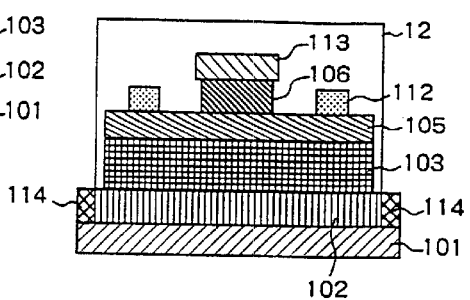
Fig. 2 f (PRIOR ART)
Fig. 2 c (PRIOR ART)
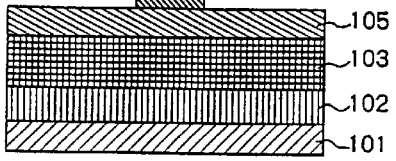
Fig. 2 d (PRIOR ART)
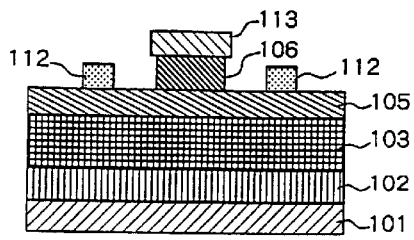

US 6,492,664 B2

HETEROJUNCTION BIPOLAR TRANSISTOR WITH REDUCED OFFSET VOLTAGE

BACKGROUND OF THE INVENTION (1) Field of the Invention

The present invention relates to a heterojunction bipolar transistor comprising different kinds of joined semiconductors, and a manufacturing method thereof.

(2) Description of the Prior Art

A heterojunction bipolar transistor (HBT) is a transistor for use in compound semiconductor integrated circuits. As an exemplary device structure of the HBT, FIG. 1 shows a structure of an npn-type HBT with its emitter on the top, and FIGS. 2a to 2f illustrate manufacturing steps thereof.

In the first place, as shown in FIG. 2a, subcollector layer 102, collector layer 103, base layer 105, and emitter layer 106 are sequentially formed on insulating substrate 101 by using an epitaxial growth method or the like. Then, a metal film which is to serve as emitter electrode 113, later described, is deposited over the entire surface thereof.

Next, as shown in FIG. 2b, photoresist 10 of a predetermined pattern is formed on the metal film and used as a mask to process the metal film, thereby providing emitter electrode 113. Then, photoresist 10 and emitter electrode 113 are used as a mask to remove emitter layer 106 until the surface of base layer 105 is exposed as shown in FIG. 2c.

Subsequently, photoresist 10 is removed, and a new photoresist mask of a predetermined pattern is formed on the exposed surface of base layer 105 and used to form base electrode 112 as shown in FIG. 2d through vapor deposition and lift-off procedures. Next, as shown in FIG. 2e, photoresist 11 of a predetermined pattern is formed and used as a mask to remove collector layer 103 until the surface of subcollector layer 102 is exposed.

Then, photoresist 11 is removed and photoresist 12 of a predetermined pattern is formed and used as a mask to inject a predetermined impurity into subcollector layer 102 with an ion implantation technique, thereby forming insulating injection area 114 as shown in FIG. 2f.

Finally, photoresist 12 is removed, a photoresist of a predetermined pattern is formed on the exposed surface of subcollector layer 102 and used as a mask to form collector electrode 111 through vapor deposition and lift-off procedures, thereby obtaining the npn-type HBT device in FIG. 1.

In the aforementioned npn-type HBT, since the junction area (SBC) between base layer 105 and collector layer 103 is larger than the junction area (SBE) between emitter layer 106 and base layer 105, offset voltage occurs in a three-terminal I-V characteristic as shown in FIG. 3. In FIG. 3, the vertical axis represents collector current $I_C$(A) while the horizontal axis represents voltage $V_{CE}$(V) between the collector and the emitter. The offset voltage shown in FIG. 3 also occurs on conditions as described below.

FIG. 4 is a diagram showing energy bands in an HBT. In the example, difference ΔEBC (=Egc−Egb) between the band gap (Egb) of base layer 302 and the band gap (Egc) of collector layer 303 is smaller than difference ΔEBE (=Ege−Egb) between the band gap (Ege) of emitter layer 301 and the band gap (Egb) of base layer 302. The offset voltage occurs when ΔEBC<ΔEBE as in the example.

When the aforementioned offset voltage is large, power consumption is greater in a digital IC using an HTB, or power added efficiency is lower in a power amplifier using an HBT, for example.

To avoid the problems, several device structures have been proposed for reducing the offset voltage. As an example, FIG. 5 shows a cross-sectional structure of an HBT which achieves a reduction in offset voltage. The HBT includes collector layer insulation area 131 obtained by insulating the portion of collector layer 103 in the aforementioned HBT shown in FIG. 1 which is joined to an outward base area (an area adjacent to an inward base area directly below the emitter layer) of base layer 105. The provision of collector layer insulation area 131 in collector layer 103 in this manner can reduce the junction area (SBC) between base layer 105 and collector layer 103 to achieve a reduction in the offset voltage.

A structure capable of reducing the offset voltage without using ion implantation is a DHBT (Double Heterojunction Bipolar Transistor). FIG. 6 shows a cross-sectional structure of such a DHBT. The HBT includes collector layer 141 using a semiconductor with a wide energy band gap instead of collector layer 103 in the structure of the aforementioned HBT shown in FIG. 1. With the structure, ΔEBE can be equal to ΔEBC to allow a reduction in the offset voltage.

The aforementioned structures of the respective HBTs capable of reducing the offset voltage, however, present problems as below.

In the structure of the HBT shown in FIG. 5, since collector layer insulation area 131 is formed by ion-implanting an impurity into the portion joined to the outward base area close to a device intrinsic area, it is conceivable that the impurity can be diffused to the device intrinsic area. Such diffusion of the impurity to the device intrinsic area brings about a lower current gain in an HTPT test (high temperature passage test) to contribute to reduce reliability of the device.

In the structure of the DHBT shown in FIG. 6, ΔEBE is equal to ΔEBC and thus ΔEBC causes carriers in operation of the device to be blocked, thereby presenting a problem of reducing collector injection efficiency.

SUMMARY OF THE INVENTION

It is an object of the present invention to provide a heterojunction bipolar transistor capable of solving the aforementioned problems, providing high reliability of a device, and reducing offset voltage without reducing collector injection efficiency, and a manufacturing method thereof.

To achieve the aforementioned object, a heterojunction bipolar transistor of the present invention comprises a collector layer, a base layer, and an emitter layer stacked sequentially, wherein the base layer comprises a first base layer joined to the collector layer in an inward base area directly below the emitter layer and a second base layer joined to the collector layer in an outward base area adjacent to the inward base area. The second base layer is formed of a semiconductor with a wider energy band gap than the collector layer.

A method of manufacturing a heterojunction bipolar transistor comprises a first step of sequentially stacking a collector layer, a first base layer, and an emitter layer, a second step of removing the first base layer in an outward base area adjacent to an inward base area directly below the emitter layer and a portion of the collector layer directly below the outward base area, and a third step of forming an insulating film made of a predetermined material on the entire surface of the inward base area to sequentially form a second base layer made of a semiconductor with a wider energy band gap than the collector layer and the first base layer on the collector layer from which the portion has been removed in the second step through selective re-growth by using the insulating film.

Another method of manufacturing a heterojunction bipolar transistor comprises a first step of sequentially stacking a collector layer and a first base layer made of a semiconductor with a wider energy band gap than the collector, a second step of forming an insulating film made of a predetermined material on the entire surface of the first base layer and removing the first base layer in an inward base area directly below an emitter layer to be formed on the first base layer and the insulating film on the inward base area to expose a surface of the collector layer, a third step of re-growing a second collector layer on the surface of the collector layer exposed in the second step, and a fourth step of removing the insulating film and then sequentially forming a second base layer made of a predetermined material and the emitter layer made of a semiconductor with a wider energy band gap than the second base layer through re-growth.

As described above, in the present invention, since the energy band gap of the second base layer joined to the collector layer in the outward base area is wider than that of the collector layer, the second base layer suppresses current injection from the collector layer in the junction. In this case, the occurrence of offset voltage is determined by the relationship between the junction area (SBE) between the emitter layer and the first base layer and the junction area (SBC) between the first base layer and the collector layer. In this manner, in the present invention, the junction area (SBC) can be reduced by the provision of the second base layer in the outward base area. Thus, the junction area (SBE) can be substantially the same size as the junction area (SBC).

According to the present invention, the difference in band gaps between the second base layer and the collector layer joined to each other in the outward base area can be larger than the difference in band gaps between the first base layer and the emitter layer joined to each other in the inward base area. with this configuration, collector current in the outward base area is reduced.

In addition, according to the present invention, since a semiconductor of the same material system is used for the first base layer and the collector layer joined to each other in the inward device area, collector injection efficiency is not reduced due to the wide band gap in these layers.

Furthermore, according to the present invention, a material with a wide band gap is used for the second base layer in the outward base area in contact with a base electrode, thereby causing no increase in contact resistance.

As described above, according to the present invention, since ion implantation is not performed near a device intrinsic area, reduced device reliability as conventional is not found. In addition, the use of a semiconductor with a wide band gap only in the outward base area results in no reduction in collector injection efficiency.

The above and other objects, features, and advantages of the present invention will become apparent from the following description with reference to the accompanying drawings which illustrate examples of the present invention.

BRIEF DESCRIPTION OF THE DRAWINGS

FIG. 2a is a cross section illustrating a step in the manufacturing procedure of the heterojunction bipolar transistor shown in FIG. 1;

FIG. 2b is a cross section illustrating a step in the manufacturing procedure of the heterojunction bipolar transistor shown in FIG. 1;

FIG. 2c is a cross section illustrating a step in the manufacturing procedure of the heterojunction bipolar transistor shown in FIG. 1;

FIG. 2d is a cross section illustrating a step in the manufacturing procedure of the heterojunction bipolar transistor shown in FIG. 1;

FIG. 2e is a cross section illustrating a step in the manufacturing procedure of the heterojunction bipolar transistor shown in FIG. 1;

FIG. 2f is a cross section illustrating a step in the manufacturing procedure of the heterojunction bipolar transistor shown in FIG. 1;

DESCRIPTION OF THE PREFERRED EMBODIMENTS

Next, description is made for embodiments of the present invention with reference to the drawings.

Figure 1:
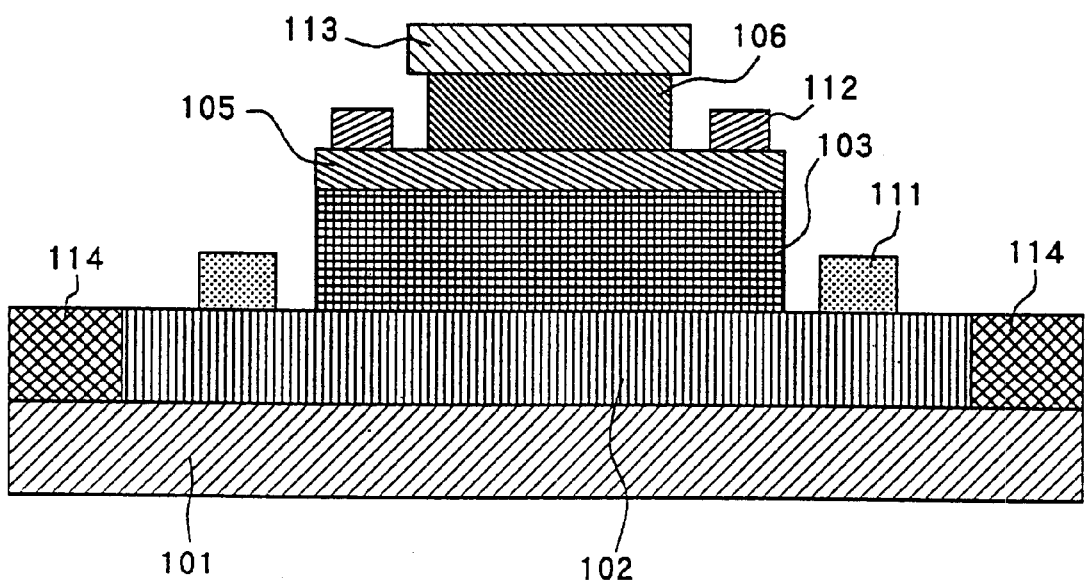
FIG. 1 is a schematic cross section showing a device structure of an npn-type heterojunction bipolar transistor with its emitter on the top, which is an example of a conventional heterojunction bipolar transistor.
Figure 7:
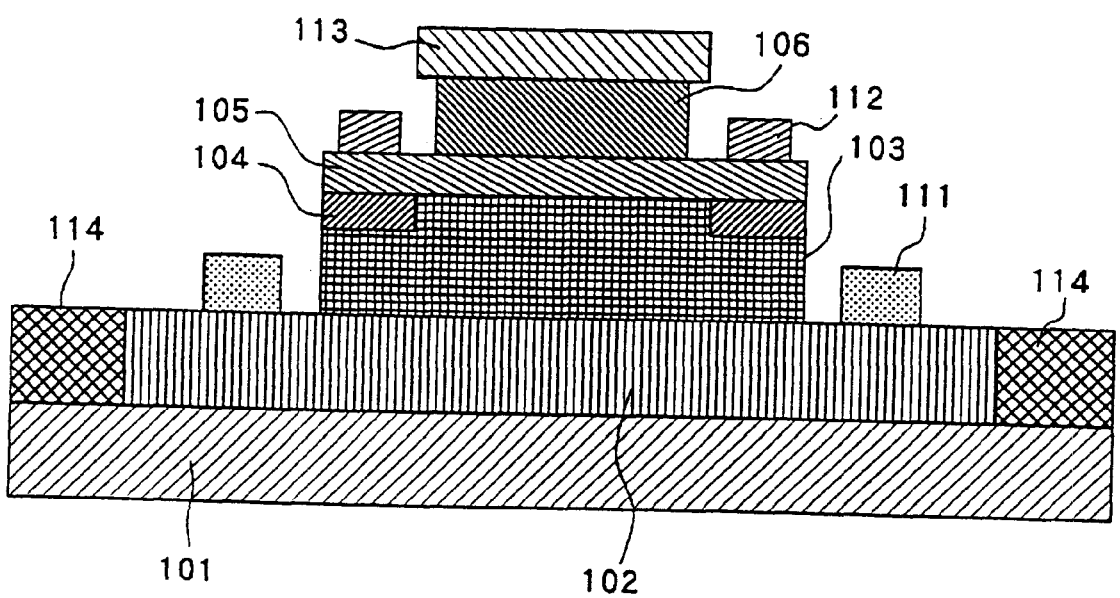
FIG. 7 is a schematic cross section showing a structure of a heterojunction bipolar transistor which is an embodiment of the present invention.

FIG. 7 shows a schematic cross-sectional structure of a heterojunction bipolar transistor (HBT) according to an embodiment of the present invention. The HBT is the same as the structure shown in FIG. 1 except that base layer 104 is newly provided. Base layer 104 is formed of a semiconductor with a wider band gap than base layer 105, and base layer 104 and base layer 105 constitute a base layer of two-layer structure. Base layer 105 is joined to collector layer 103 in an inward base area (corresponding to a device intrinsic area) directly below emitter layer 106, and base layer 104 is joined to collector layer 103 in an outward base area (the area on the end of collector layer 103) adjacent to the inward base area.

Figure 8:
FIG. 8a is a cross section illustrating a step in the manufacturing procedure of the heterojunction bipolar transistor shown in FIG. 7.
FIG. 8b is a cross section illustrating a step in the manufacturing procedure of the heterojunction bipolar transistor shown in FIG. 7.
FIG. 8c is a cross section illustrating a step in the manufacturing procedure of the heterojunction bipolar transistor shown in FIG. 7.
FIG. 8d is a cross section illustrating a step in the manufacturing procedure of the heterojunction bipolar transistor shown in FIG. 7.
FIG. 8e is a cross section illustrating a step in the manufacturing procedure of the heterojunction bipolar transistor shown in FIG. 7.
FIG. 8f is a cross section illustrating a step in the manufacturing procedure of the heterojunction bipolar transistor shown in FIG. 7.
FIG. 8g is a cross section illustrating a step in the manufacturing procedure of the heterojunction bipolar transistor shown in FIG. 7.
Figure 8:
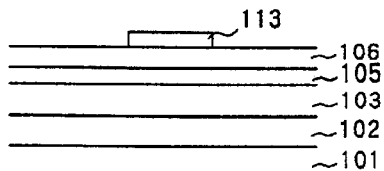
Figure 8:
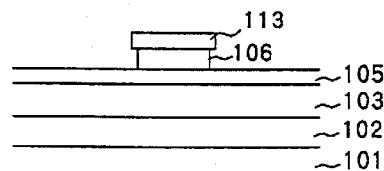
Figure 8:
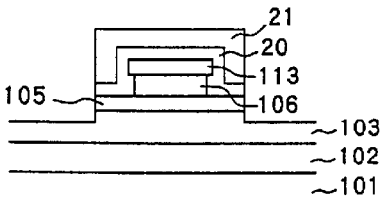
Figure 8:
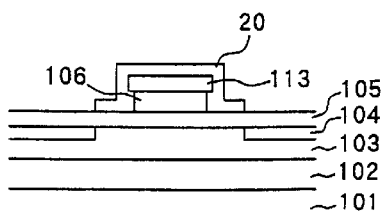
Figure 8:
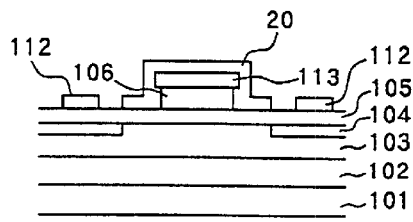
Figure 8:
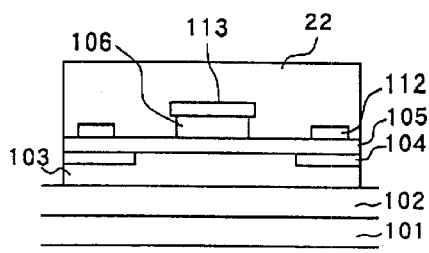

FIGS. 8a to 8g are cross sections showing steps in the manufacturing procedure of the aforementioned HBT. In the first place, as shown in FIG. 8a, subcollector layer 102, collector layer 103, base layer 105, and emitter layer 106 are sequentially formed on insulating substrate 101 by using an epitaxial growth method or the like. Then, a metal film which is to serve as emitter electrode 113, later described, is deposited over the entire surface thereof.

Next, a photoresist of a predetermined pattern is formed on the metal film and used as a mask to process the metal film through dry etching, thereby providing emitter electrode 113 as shown in FIG. 8b. Emitter electrode 113 may be formed by well-known vapor deposition and lift-off procedures using a photoresist mask. After emitter electrode 113 is formed, the photoresist used as the mask is removed.

Subsequently, as shown in FIG. 8c, emitter electrode 113 is used as a mask to remove emitter layer 106 until the surface of base layer 105 is exposed through wet etching or dry etching. After $SiO_2$ film 20 is formed over the entire surface and photoresist 21 of a predetermined pattern is formed, photoresist 21 is used as a mask to partially remove $SiO_2$ film 20, base layer 105, and collector layer 103 as shown in FIG. 8d.

Next, photoresist 21 is removed, and then base layer 104 of a predetermined material is formed as shown in FIG. 8e by selective regrowth and base layer 105 is formed. The selective regrowth refers to selective growth of GaAs on the surface of a GaAs film by utilizing the fact that a material such as GaAs is not formed on $SiO_2$.

Then, base electrode 112 is formed as shown in FIG. 8f on base layer 105 through well-known vapor deposition and lift-off procedures using a photoresist mask. Next, as shown in FIG. 8g, $SiO_2$ film 20 is removed, and photoresist 22 of a predetermined pattern is formed and used as a mask to sequentially remove base layers 105, 104, and collector layer 103, thereby exposing the surface of subcollector layer 102.

After photoresist 22 is removed, a photoresist of a predetermined pattern is formed and used as a mask to remove collector layer 103 until the surface of subcollector layer 102 is exposed. The photoresist used as the mask is removed, and a photoresist of a predetermined pattern is formed and used as a mask to form insulating injection area 114 by injecting a predetermined impurity into subcollector layer 102 with an ion implantation technique.

Finally, the photoresist used as the mask is removed, and a photoresist of a predetermined pattern is formed on the exposed surface of subcollector layer 102 and used as a mask to form collector electrode 111 through vapor deposition and lift-off procedures, thereby obtaining the npn-type HBT device in FIG. 7.

With the HBT device structure of the embodiment, base layer 104 with a wide band gap joined to collector layer 103 in the outward base area suppresses current injection from collector layer 103 in the junction. Thus, the occurrence of offset voltage is determined by the relationship between the junction area (SBE) between emitter layer 106 and base layer 105 and the junction area (SBC) between base layer 105 and collector layer 103. Since the junction area (SBE) is substantially the same as the junction area (SBC) in the embodiment, the offset voltage shown in FIG. 3 described above can be reduced.

Figure 9:
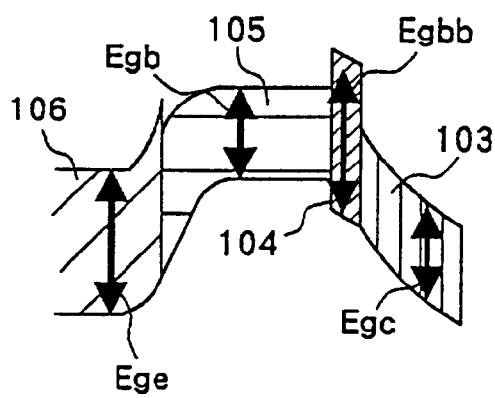
FIG. 9 is a diagram showing the energy bands in the heterojunction bipolar transistor shown in FIG. 7.

The relationship of band gap widths among respective layers in the HBT device of the embodiment is as follows. FIG. 9 is a diagram showing the energy bands in the HBT shown in FIG. 7. Difference $\Delta EBBC$ ($=Egc-Egbb$) between the band gap (Egbb) of base layer 104 (on the side of the outward base area) with a wide band gap joined to the area on the end of collector layer 103 and the band gap (Egc) of collector layer 103 is larger than difference $\Delta EBE$ ($=Ege-Egb$) between the band gap (Ege) of emitter layer 106 and the band gap (Egb) of base layer 105. Thus, collector current is small in the outward base area, and as a result, the offset voltage is reduced.

Next, detailed description is made for the reason of the reduced offset voltage with a specific example in which the HBT device of the embodiment is applied to.

First Example

Figure 10:
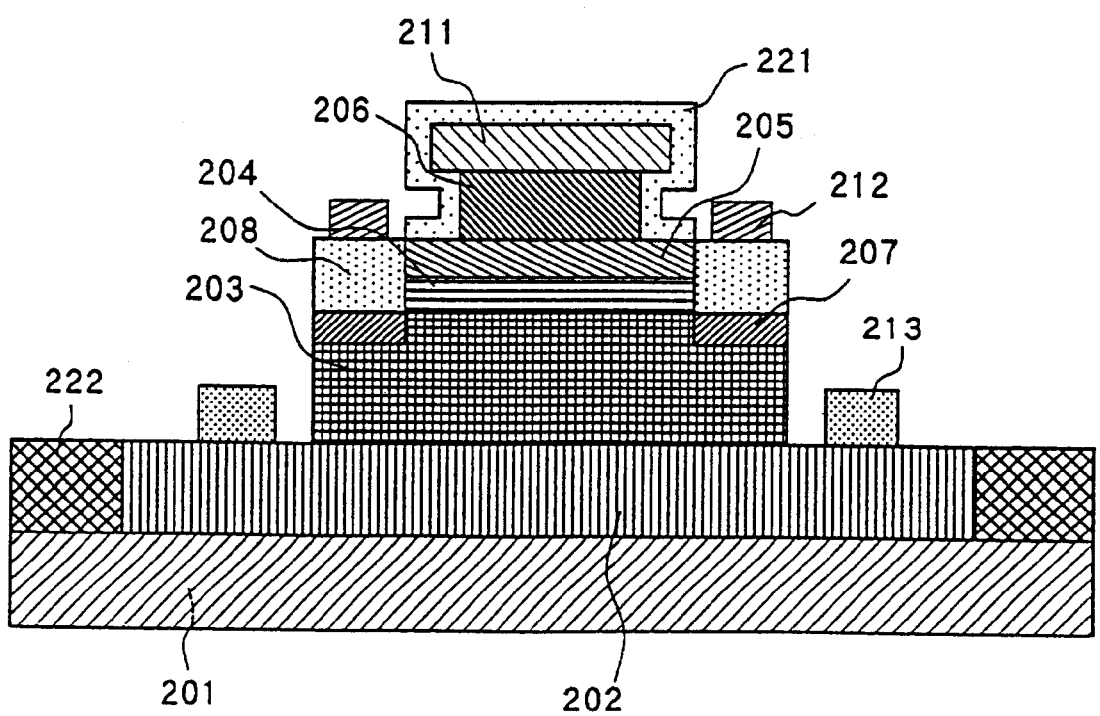
FIG. 10 is a schematic cross section showing a structure of a heterojunction bipolar transistor of a first example to which the device structure of the heterojunction bipolar transistor shown in FIG. 7 is applied.

FIG. 10 shows an HBT device structure of a first example to which the HBT device structure shown in FIG. 7 is applied, and FIGS. 11a to 11g illustrate manufacturing steps thereof.

Figure 11A:
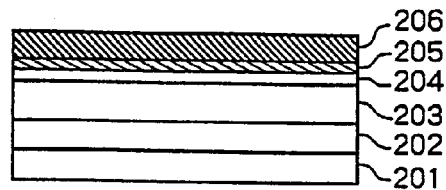
FIG. 11a is a cross section illustrating a step in the manufacturing procedure of the heterojunction bipolar transistor shown in FIG. 10.

The example employs an epitaxial wafer, as shown in FIG. 11a, which has n-type subcollector layer 202 made of GaAs, n-type or non-doped collector layer 203 made of GaAs, p-type base layer 204 made of GaAs with a dopant concentration of, for example, $4 \times 10^{19}$ cm$^{-3}$, emitter layer 205 made of InGaP, and n-type emitter cap layer 206 made of GaAs or InGaAs, sequentially laminated on semi-insulating GaAs substrate 201.

A metal film which is to serve as emitter electrode 211 is formed over the entire surface of emitter cap layer 206 on the aforementioned epitaxial wafer, and photoresist 231 of a predetermined pattern is formed thereon. Next, as shown in FIG. 11b, photoresist 231 is used as a mask to process the metal film, thereby forming emitter electrode 211. Emitter electrode 211 is formed of, for example, WSi.

Figure 11E:
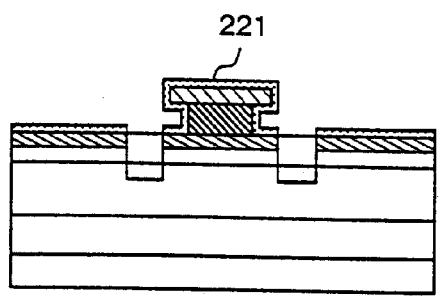
FIG. 11e is a cross section illustrating a step in the manufacturing procedure of the heterojunction bipolar transistor shown in FIG. 10.
Figure 11B:
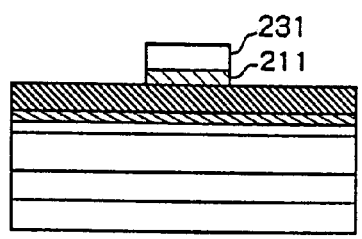
FIG. 11b is a cross section illustrating a step in the manufacturing procedure of the heterojunction bipolar transistor shown in FIG. 10.
Figure 11F:
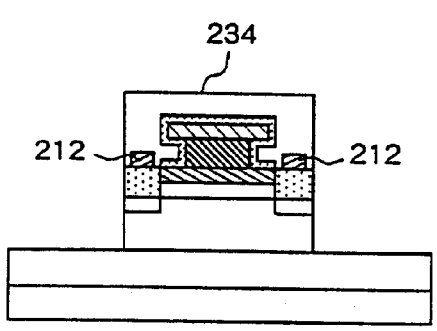
FIG. 11f is a cross section illustrating a step in the manufacturing procedure of the heterojunction bipolar transistor shown in FIG. 10.
Figure 11C:
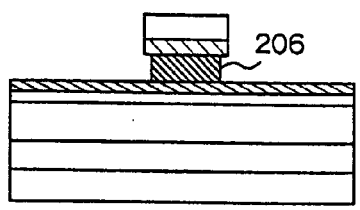
FIG. 11c is a cross section illustrating a step in the manufacturing procedure of the heterojunction bipolar transistor shown in FIG. 10.

Then, as shown in FIG. 11c, photoresist 231 and emitter electrode 211 are used as a mask to remove emitter cap layer 206 until the surface of emitter layer 205 is exposed. As shown in FIG. 11d, after photoresist 231 is removed, insulating film 221 made of $SiO_2$ or SiN is deposited on the entire surface with a CVD apparatus, and photoresist 232 of a predetermined pattern is formed thereon. Photoresist 232 is used as a mask to partially remove insulating film 221, emitter layer 205, base layer 204, and collector layer 203. With the steps, opening 233 is formed.

Next, as shown in FIG. 11e, after photoresist 232 is removed, a semiconductor (for example, AlGaAs, InGaP, or AlGaAsP) with a wider band gap than collector layer 203 is regrown in opening 233 on the surface of collector layer 203 at a higher concentration (for example, $2 \times 10^{20}$ cm$^{-3}$) than base layer 204 through selective re-growth to form base layer 207. In addition, a semiconductor of the same material as base layer 204 is re-grown on base layer 207 at a higher concentration (for example, $2 \times 10^{20}$ cm$^{-3}$) than base layer 204 to form base layer 208.

Then, base electrode 212 made of, for example, Pt/Ti/Pt/Au/Ti is formed on base layer 208 through well-known vapor deposition and lift-off procedures using a photoresist mask. In addition, photoresist 234 of a predetermined pattern is formed and used as a mask to sequentially remove insulating film 221, emitter layer 205, base layer 204, and collector layer 203, thereby exposing the surface of subcollector layer 202 (see FIG. 11f).

Figure 11G:
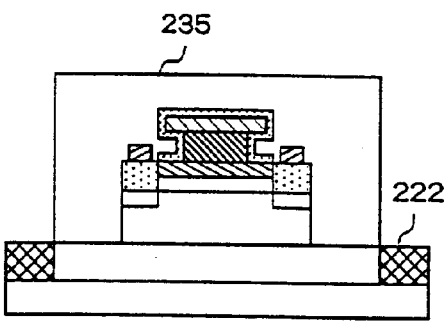
FIG. 11g is a cross section illustrating a step in the manufacturing procedure of the heterojunction bipolar transistor shown in FIG. 10.
Figure 11D:
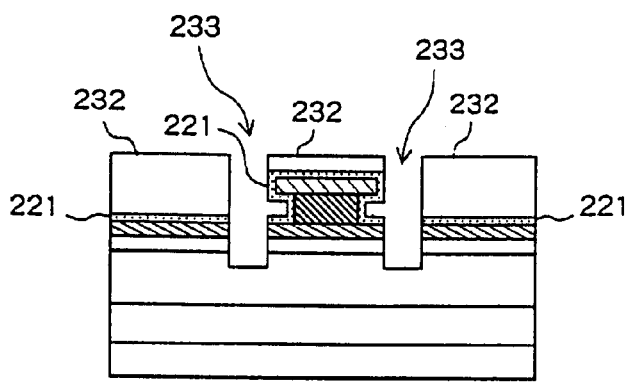
FIG. 11d is a cross section illustrating a step in the manufacturing procedure of the heterojunction bipolar transistor shown in FIG. 10.

Subsequently, as shown in FIG. 11g, after photoresist 234 is removed, photoresist 235 of a predetermined pattern is formed and used as a mask to form interelement isolation area 222 by ion-implanting a predetermined impurity from the exposed surface of subcollector layer 202.

Finally, after photoresist 235 is removed, collector electrode 213 made of, for example, AuGe/Ni/Au is formed on subcollector layer 202 through well-known vapor deposition and lift-off procedures using a photoresist to obtain the HBT device shown in FIG. 10.

Figure 3:
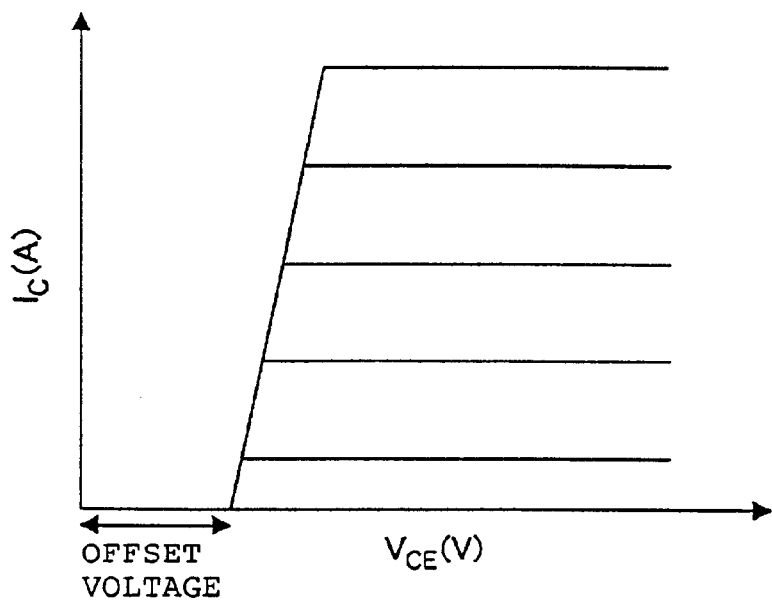
FIG. 3 is a graph schematically illustrating offset voltage in a three-terminal I-V characteristic.
Figure 4:
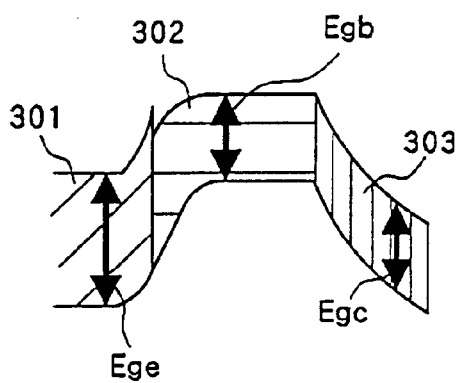
FIG. 4 is a diagram showing energy bands in a conventional heterojunction bipolar transistor.
Figure 5:
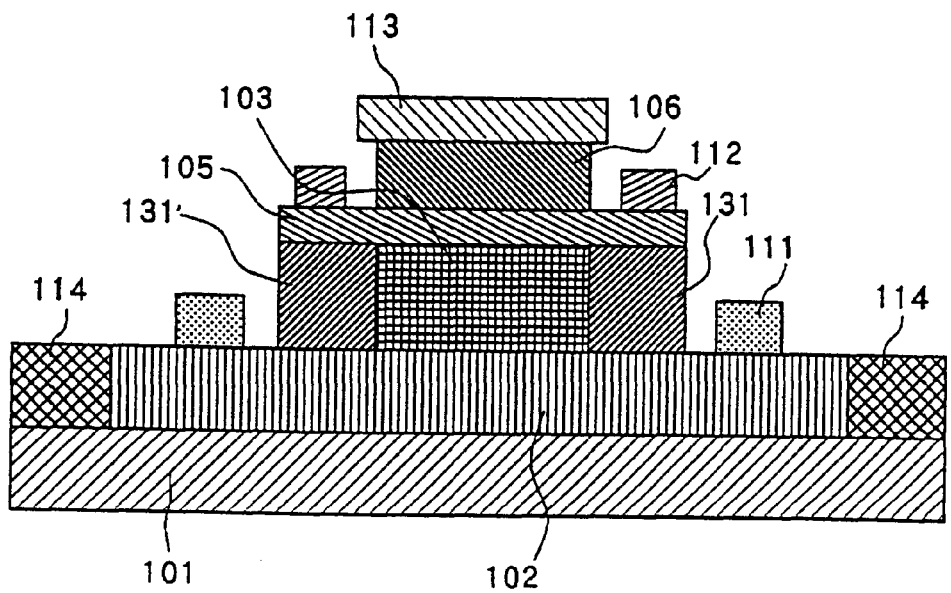
FIG. 5 is a schematic cross section showing a structure of an exemplary conventional heterojunction bipolar transistor.
Figure 6:
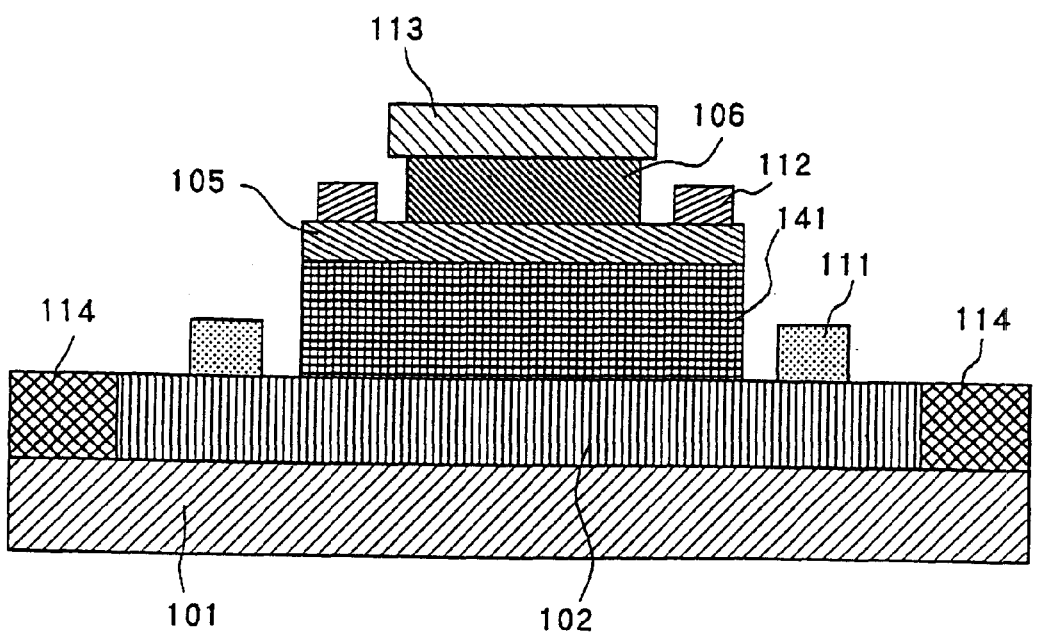
FIG. 6 is a schematic cross section showing a structure of a DHBT which is an exemplary conventional heterojunction bipolar transistor.

In the HBT device of the embodiment configured as described above, the aforementioned offset voltage in the three-terminal I-V characteristic in FIG. 3 can also be reduced. Detailed description is hereinafter made for the reason of the reduced offset voltage.

As described in the aforementioned Prior Art, the offset voltage occurs in either of the following two conditions in an npn-type HBT device with its emitter on the top:

(1) SBE<SBC
(2) ΔEBC<ΔEBE

In the HBT device of the example, like the state of the energy bands in FIG. 9 described above, difference ΔEBBC (=Egc−Egbb) between the band gap (Egc) of collector layer 203 and the band gap (Egbb) of base layer 207 (on the side of the outward base area) with a wide band gap joined to the area on the end of collector layer 203 is larger than difference ΔEBE (=Ege−Egb) between the band gap (Ege) of emitter layer 205 and the band gap (Egb) of base layer 204. Thus, collector current is reduced in the outward base area, and as a result, the offset voltage is reduced.

Since the semiconductor of the same material is used for base layer 204 corresponding to an intrinsic area and collector layer 203, no reduction occurs in collector injection efficiency due to the wide band gap.

In addition, a material with a wide band gap is not used for base layer 208 in the outward base area in contact with base electrode 212, thereby causing no increase in contact resistance.

Since the base layers (207, 208) in the outward base area have great thicknesses and impurity concentrations higher than base layer 204 in the device intrinsic area, sheet resistance of the base layers in the outward base area can be reduced without reducing current gain to produce the effect of improved high-frequency characteristics.

With the aforementioned effects, lower power consumption can be achieved when the HBT of the example is applied to a digital IC, and power added efficiency can be enhanced when it is applied to a power amplifier.

Second Example

The base layers with a wide band gap in the outward base area are formed through re-growth in the aforementioned first example. On the other hand, in a second example, base layers with a wide band gap are provided in forming an epitaxial layer.

FIGS. 12a to 12e illustrate manufacturing steps of an HBT device structure of the second example to which the HBT device structure shown in FIG. 7 is applied.

Figure 12A:
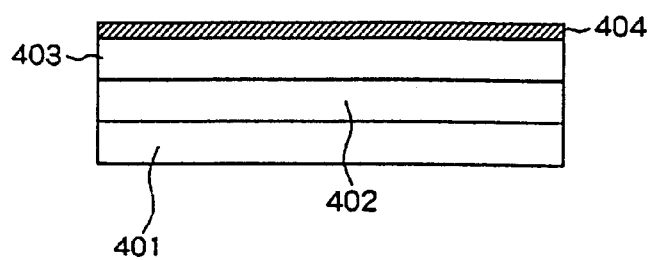
FIG. 12a is a cross section illustrating a step in the manufacturing procedure of a heterojunction bipolar transistor of a second example to which the device structure of the heterojunction bipolar transistor shown in FIG. 7 is applied.

The second example employs an epitaxial wafer as shown in FIG. 12a which comprises semi-insulating GaAs substrate 401, n-type subcollector layer 402 made of GaAs, n-type or non-doped collector layer 403 made of GaAs, base layer 404 made of a semiconductor with a wider band gap than collector layer 403, for example, AlGaAs, InGaP, or AlGaAsP, with a dopant concentration of, for example, $2 \times 10^{20}$ cm$^{-3}$.

Figure 12B:
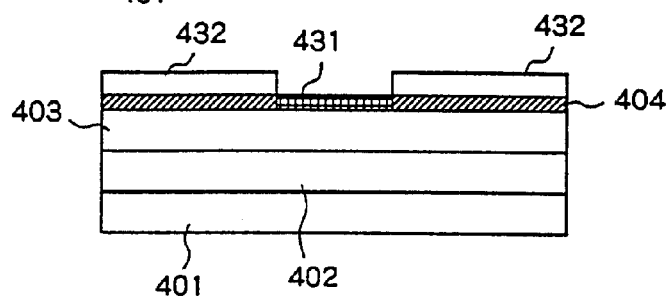
FIG. 12b is a cross section illustrating a step in the manufacturing procedure of the heterojunction bipolar transistor of the second example to which the device structure of the heterojunction bipolar transistor shown in FIG. 7 is applied.

As shown in FIG. 12b, after insulating film 432 made of $SiO_2$ or SiN is deposited on the entire surface of base layer 404 of the aforementioned epitaxial wafer using a CVD apparatus, the insulating film is opened in an intrinsic area, and collector layer 431 with the same material and same concentration as collector layer 403 is formed in the opening through re-growth.

Figure 12C:
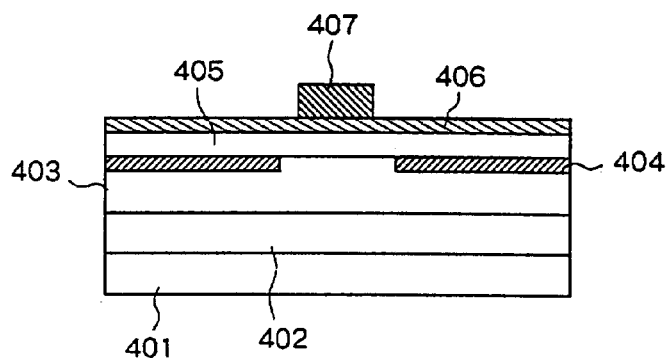
FIG. 12c is a cross section illustrating a step in the manufacturing procedure of the heterojunction bipolar transistor of the second example to which the device structure of the heterojunction bipolar transistor shown in FIG. 7 is applied.

Next, as shown in FIG. 12c, after insulating film 432 is removed on the entire surface, p-type base layer 405 made of GaAs, n-type emitter layer 406 made of a semiconductor with a wider band gap than base layer 405, for example InGaP or AlGaAs, and n-type emitter cap layer 407 made of GaAs or InGaAs are sequentially formed through re-growth.

Figure 12D:
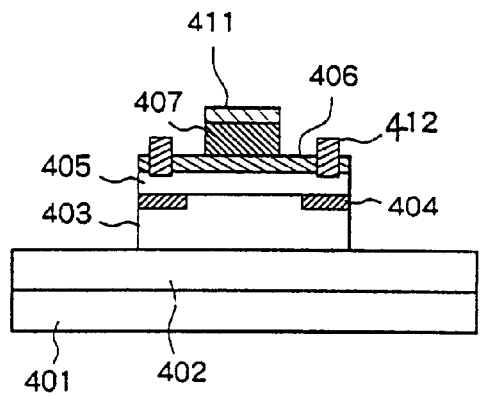
FIG. 12d is a cross section illustrating a step in the manufacturing procedure of the heterojunction bipolar transistor of the second example to which the device structure of the heterojunction bipolar transistor shown in FIG. 7 is applied.

Then, as shown in FIG. 12d, emitter electrode 411 is formed of, for example WSi, and base electrode 412 is formed of, for example Pt/Ti/Pt/Au/Ti. Contact is established to base layer 405 through sintering from above emitter 406.

Figure 12E:
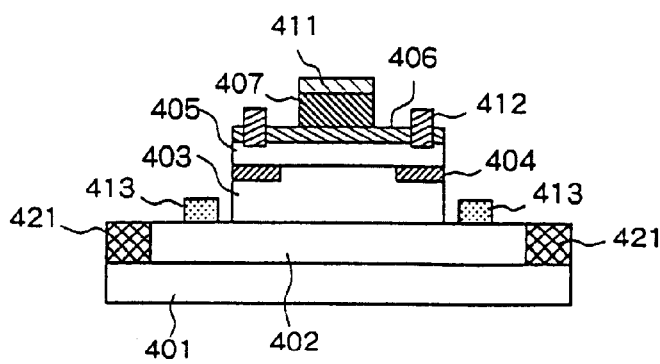
FIG. 12e is a cross section illustrating a step in the manufacturing procedure of the heterojunction bipolar transistor of the second example to which the device structure of the heterojunction bipolar transistor shown in FIG. 7 is applied.

Finally, as shown in FIG. 12e, collector electrode 413 is formed of, for example AuGe/Ni/Au, and then interelement isolation area 421 is formed with an ion implantation technique.

The HBT of the example also produces effects similar to those of the HBT of the aforementioned first example. Lower power consumption can be achieved when the HBT is applied to a digital IC, and power added efficiency can be enhanced when it is applied to a power amplifier.

As described above, according to the present invention, since the junction area (SBE) between the emitter layer and the base layer can be substantially equal to the junction area (SBC) between the base layer and the collector layer, the offset voltage can be reduced.

In addition, according to the present invention, an HBT can be provided with high device reliability since the collector injection efficiency is not reduced and the ion implantation is not performed near the device intrinsic area.

While preferred embodiments of the present invention have been described using specific terms, such description is for illustrative purposes only, and it is to be understood that changes and variations may be made without departing from the spirit or scope of the following claims.

What is claimed is:

1. A heterojunction bipolar transistor comprising a collector layer, a base layer, and an emitter layer sequentially stacked, wherein said base layer includes a first base layer joined to said collector layer in an inward base area directly below said emitter layer and a second base layer directly below said first base layer joined to said collector in an outward base area adjacent to said inward base area, said second base layer being formed of a semiconductor with an energy band gap wider than said collector layer.

2. The heterojunction bipolar transistor according to claim 1, wherein the difference in energy band gap width between said second base layer and said collector layer is larger than the difference in energy band gap width between said emitter layer and said first base layer.

3. The heterojunction bipolar transistor according to claim 1, wherein said first base layer and said collector layer are formed of a semiconductor of the same material system.

4. The heterojunction bipolar transistor according to claim 1, wherein said base layer has a two-layer structure including said first and second base layers in said outward base area and said first base layer is provided with a base electrode thereon.

* * * * *